United States Patent
Murakita

(10) Patent No.: US 7,425,823 B2
(45) Date of Patent: Sep. 16, 2008

(54) POSITION DETECTING DEVICE AND METHOD OF ADJUSTING POSITION

(75) Inventor: Masashi Murakita, Hyogo (JP)

(73) Assignee: HOYA Corporation, Tokyo (JP)

( * ) Notice: Subject to any disclaimer, the term of this patent is extended or adjusted under 35 U.S.C. 154(b) by 0 days.

(21) Appl. No.: 11/776,765

(22) Filed: Jul. 12, 2007

(65) Prior Publication Data

US 2008/0048652 A1    Feb. 28, 2008

(30) Foreign Application Priority Data

Jul. 13, 2006   (JP)   ............................. 2006-192722

(51) Int. Cl.
*G01B 7/14*   (2006.01)
(52) U.S. Cl. .............................. 324/207.24; 324/207.11
(58) Field of Classification Search ............ 324/207.11, 324/207.13, 207.24–207.26, 207.2, 251; 348/208.99, 208.1–208.16; 396/52, 55
See application file for complete search history.

(56) References Cited

U.S. PATENT DOCUMENTS

2005/0190267 A1   9/2005   Uenaka et al.

FOREIGN PATENT DOCUMENTS

| JP | 6-014907 | 2/1994 |
|---|---|---|
| JP | 2001-166194 | 6/2001 |
| JP | 2002-107606 | 4/2002 |
| JP | 2002-229090 | 8/2002 |
| JP | 2005 275379 | 10/2005 |
| JP | 2005-275379 | 10/2005 |

OTHER PUBLICATIONS

English Language Abstract of JP 2005-275379.
English language Abstract of JP 2001-166194.
English language Abstract of JP 2002-229090.
English language Abstract of JP 2002-107606.

*Primary Examiner*—Bot LeDynh
(74) *Attorney, Agent, or Firm*—Greenblum & Bernstein, P.L.C.

(57) ABSTRACT

A position detecting device has a movable unit, and a hold unit that movably holds the movable unit. One of the movable unit and the hold unit has a magnetic field generator having an engaged portion and a guide opening. A magnetic field sensor is provided on the other unit of the movable unit and hold unit. The sensor senses the magnetic field so as to detect the position of the movable unit relative to the hold unit. The magnetic field generator is fixed to the first surface after the magnetic field generator is slidingly moved by a rod member inserted into the guide opening and engaged with the engaged portion so as to dispose the magnetic field generator at a predetermined position.

12 Claims, 9 Drawing Sheets

FIG. 8
(a) 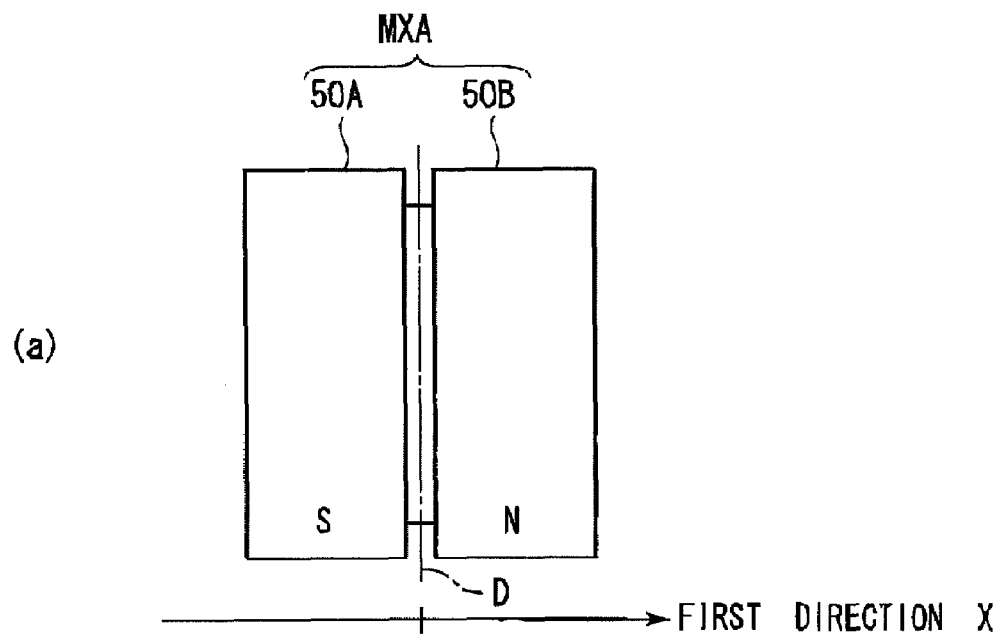
(b) 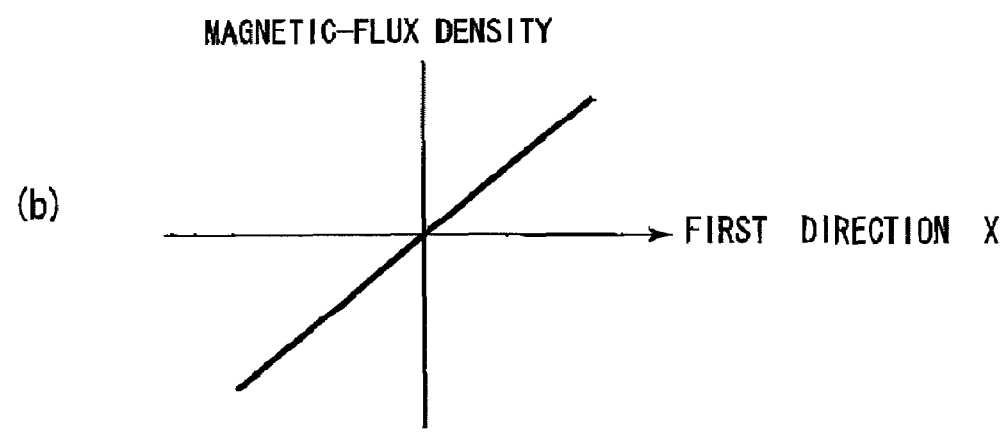
(c) 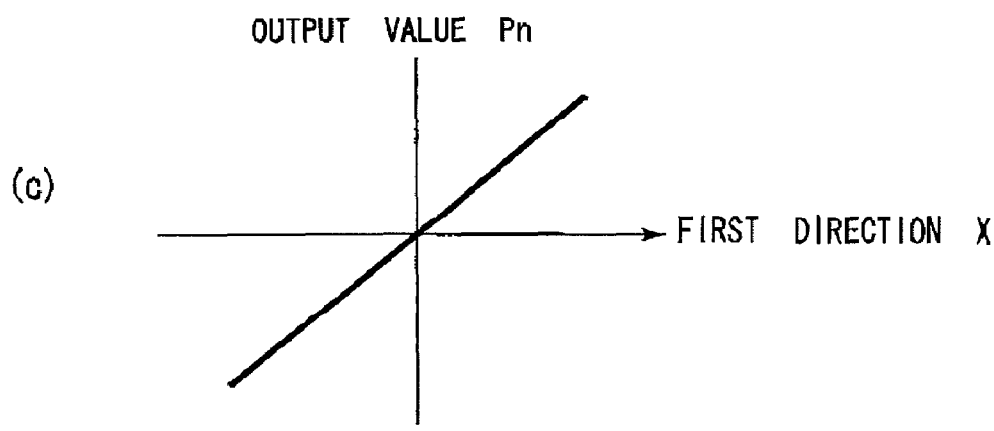

POSITION DETECTING DEVICE AND METHOD OF ADJUSTING POSITION

This application claims foreign priority based on Japanese Patent application No. 2006-192722, filed Jul. 13, 2006, the content of which is incorporated herein by reference in its entirety.

BACKGROUND OF THE INVENTION

1. Field of the Invention

The present invention relates to a position detecting device for detecting the position of a movable unit relative to the position of a hold unit using a magnetic field generator and a magnetic field sensor, and relates to a method of adjusting the position of the magnetic field generator.

2. Description of the Related Art

Conventionally, it is known that an anti-shaking apparatus is often provided in a photographing device such as a camera. The anti-shaking apparatus moves an imaging sensor or a correcting lens in a plane which is perpendicular to the optical axis, by an amount corresponding to the hand-shake amount, so as to reduce the image blur in the image-forming plane.

U.S. patent application publication NO. 2005/0190267 discloses an anti-shaking apparatus which has a movable unit having an imaging sensor, and a hold unit which movably holds the movable unit. In this apparatus, the movable unit includes a hall element and a coil, and the hold unit includes a magnet.

The movable unit is moved together with the imaging sensor by the coil and the magnet, according to the hand-shake amount, in order to reduce the image blur in the imaging sensor. The hall element detects the position of the movable unit based on the magnetic flux density generated by the magnet. Due to this detection, because the position of the movable unit is known, the movable unit is moved to the correct position to reduce the image blur.

It is preferable that the hall element faces the center of the magnet in order to maximize the detection capability of the hall element when the movable unit is arranged in a standard position.

Generally, when the anti-shaking apparatus is assembled, the movable unit and the hold unit are built into one body unit after the hall element and the magnet are mounted on the movable unit and the hold unit, respectively. However, when the movable unit and the hold unit are built into one body unit, it is difficult to dispose the hall element so that it faces the center position of the magnet, particularly in the case where two or more two hall elements are provided in the movable unit.

SUMMARY OF THE INVENTION

Therefore, an object of the present invention is to provide a method for accurately adjusting the position of a magnetic field generator relative to the position of a magnetic field sensor, and a position detecting device having a magnetic field generator whose position is accurately adjusted to the predetermined position.

According to the present invention, there is provided a position detecting device which has a movable unit, a hold unit that movably holds the movable unit, a magnetic field generator, a magnetic field sensor, a guide portion, and an engaged portion. One of the movable unit and the hold unit has a first surface and a second surface which are opposite each other. The magnetic field generator is provided on the first surface and generates a magnetic field. The magnetic field sensor is provided an the other unit, of the movable unit and the hold unit, to that which the magnetic field generator is provided on, and the sensor senses the magnetic field so as to detect the position of the movable unit relative to the hold unity. The guide portion has a guide opening that penetrates from the second surface through to the first surface. The engaged portion is provided on the magnetic field generator and is disposed at a position corresponding to the guide opening.

The magnetic field generator is fixed to the first surface after the magnetic field generator has been slidingly moved along the first surface by way of a rod member which is inserted into the guide opening and engaged with the engaged portion so as to dispose the magnetic field generator at a predetermined position.

BRIEF DESCRIPTION OF THE DRAWINGS

The objects and advantages of the present invention will be better understood from the following description, with reference to the accompanying drawings in which:

FIG. 8 is a graph showing the relationship between the relative position of the generator, the magnetic-flux density at the hall element, and the output value of a hall output signal;

DESCRIPTION OF THE PREFERRED EMBODIMENTS

Figure 1:
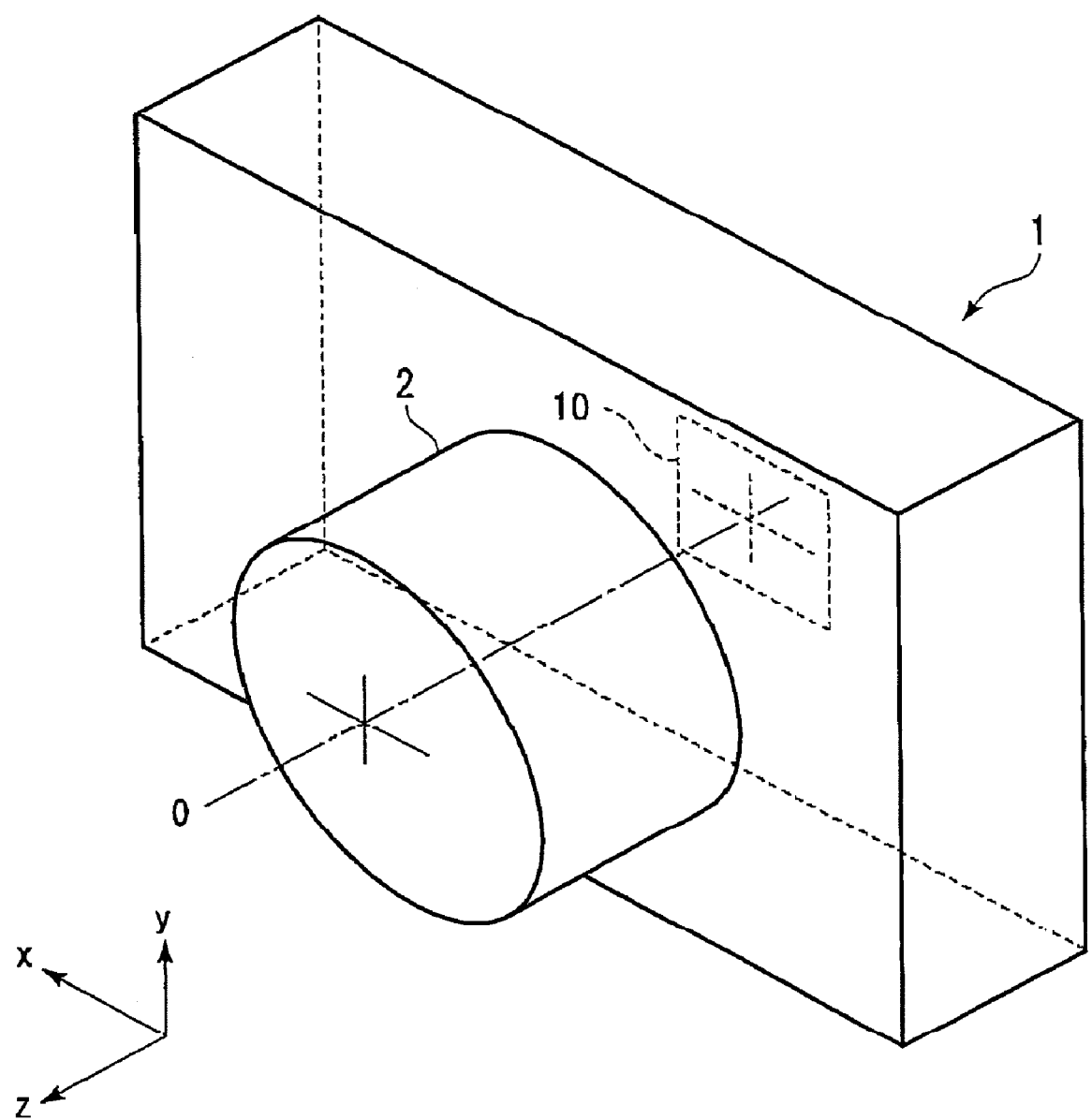
FIG. 1 is a perspective view of a photographing apparatus of an embodiment of this invention.

The present invention will be described below with reference to the embodiments shown in the drawings.

FIG. 1 shows a photographing apparatus of an embodiment of this invention. Further, in the explanation below, it is presumed that the photographing apparatus is a digital camera.

The digital camera has a lens barrel 2 and an anti-shake unit (an image stabilizing unit) 10 provided in a camera body 1 thereof. The barrel lens 2 includes a photographing lens (not shown in the figure) therein, and the photographing lens has an optical axis O.

Hereinafter, a horizontal direction which is perpendicular to the optical axis O is defined as the "first direction x", a vertical direction which is perpendicular to the optical axis O and perpendicular to the first direction x is defined as the "second direction y", and a horizontal direction which is parallel to the optical axis O is defined as the "third direction z".

Figure 2:
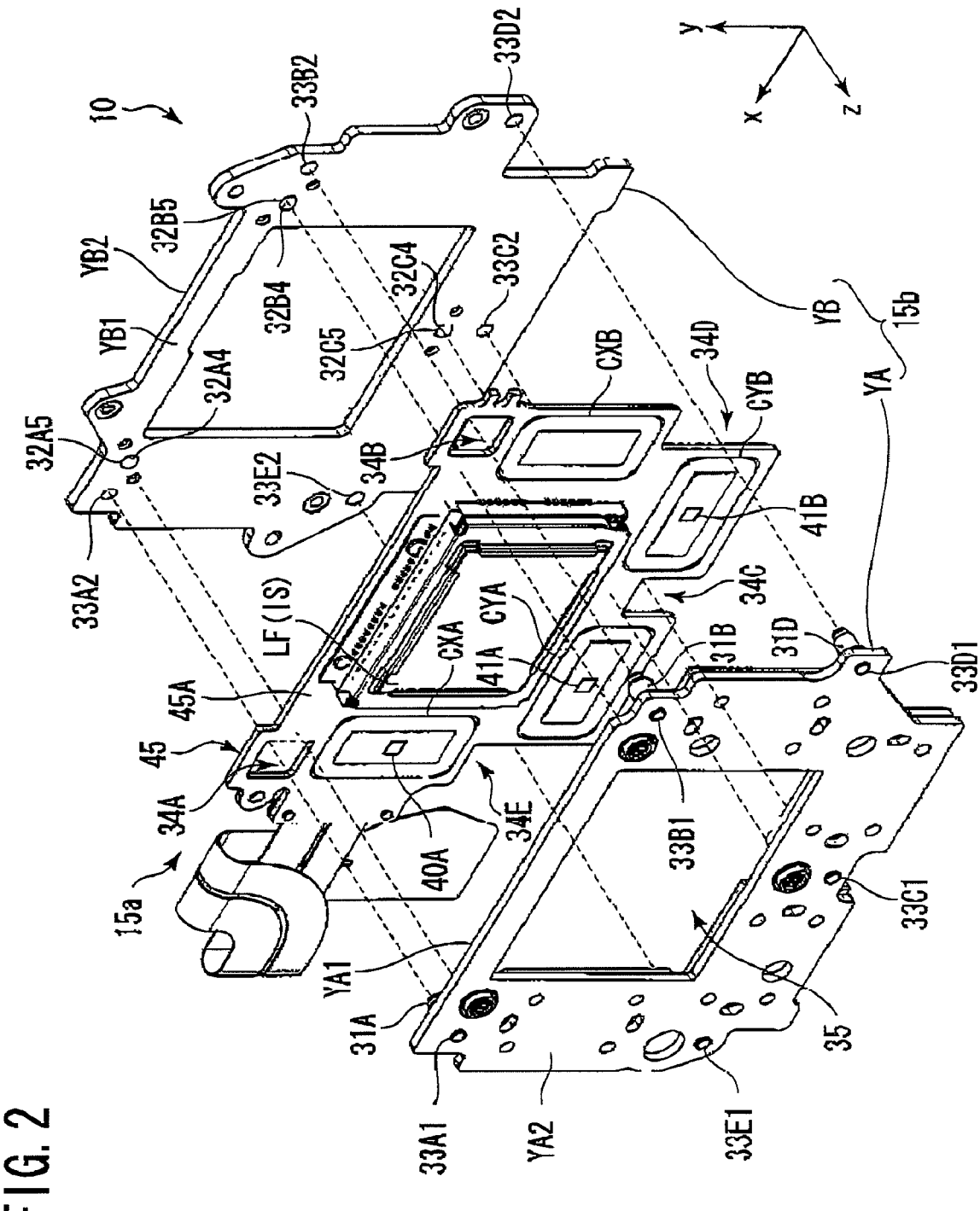
FIG. 2 is an exploded perspective view of an anti-shake unit viewed from a first yoke side.
Figure 3:
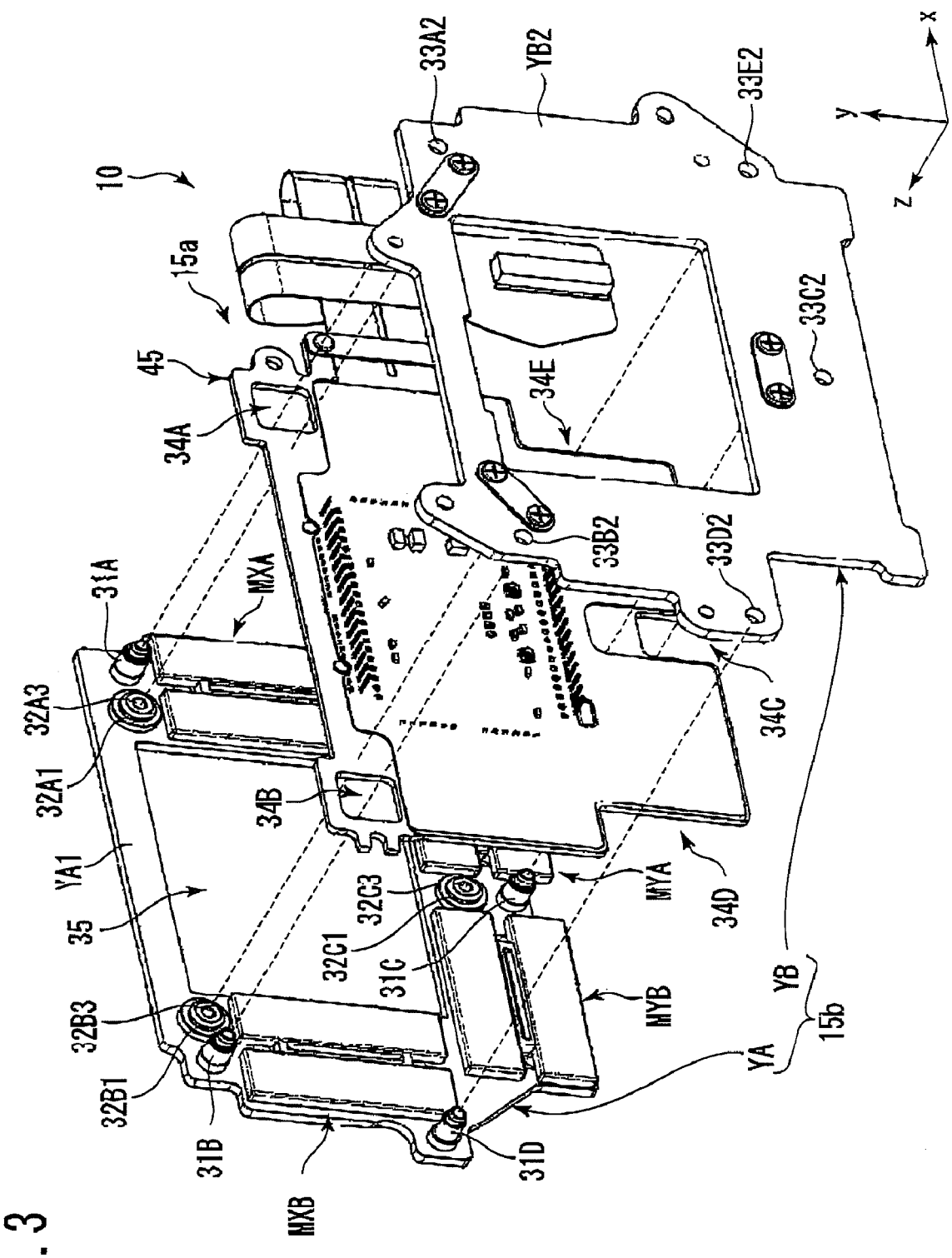
FIG. 3 is an exploded perspective view of the anti-shake unit viewed from a second yoke side.

FIGS. 2 and 3 show an anti-shake unit as provided in the photographing apparatus. The anti-shake unit 10 includes a movable unit 15a, and a hold unit 15b which is fixed to the camera body 1. The movable unit 15a has a low-pass filter LF, an imaging sensor IS, a base member 45, first and second horizontal driving coils CXA and CXB, first and second vertical driving coils CYA and CYB, a horizontal hall element (magnetic field sensor) 40A, and first and second vertical hall elements (magnetic field sensors) 41A and 41B.

The hold unit 15b has first and second yokes YA and YB, first to fifth poles 31A-31E (see FIG. 4), a plurality of balls, a plurality of ball receivers, first and second horizontal magnetic field generators MXA and MXB, and first and second vertical magnetic field generators MYA and MYB.

The photographic subject image is captured as an optical image through the photographing lens by an imaging sensor IS, such as a CCD, etc., so that the image which has been captured is indicated on the display of the camera after an A/D converting operation and an image processing operation. Further, the image signal obtained by the imaging operation is stored in the memory.

The anti-shake unit 10 is an apparatus that reduces the effect of hand-shake by moving a movable unit 15a along a plane (hereinafter "plane xy") perpendicular to an optical axis O, by canceling the lag corresponding to a hand-shake quantity, of a photographic subject image on the imaging surface of the imaging sensor IS, and by stabilizing the photographing subject image that reaches the imaging surface of the imaging sensor IS.

Further, the anti-shake unit 10 detects the position of the movable unit is a relative to the hold unit 15b using the magnetic field generators and the hall element sensors.

The movable unit 15a is interposed between the first and second yoke YA and YB such that the movable unit 15a is movably held by the hold unit 15b through a plurality or balls. The movable unit 15a can move along the plane xy between first and second yokes YA and YB.

The first and second yokes YA and YB, which include magnetic metal plates, are arranged facing each other in the third direction z, and such that they lie in a plane perpendicular to the third direction z. The first and second yokes YA and YB are arranged in the third direction z. The first and second yokes YA and YB have facing surfaces YA1 and YB1 which face the movable unit 15a, respectively. Further, the first and second yokes YA and YB have opposite surfaces YA2 and YB2 which are opposite surfaces to the facing surfaces YA1 and YB1, respectively. The facing surfaces YA1 and YB1 and opposite surfaces YA2 and YB2 lie in a plane which is parallel to both first direction x and second direction y, namely parallel to the plane xy.

The first to fifth poles 31A-31E, which extend in a direction parallel to the third direction z, are disposed between the first and second yokes YA and YB. One end of each of the first to fifth poles 31A-31E is mounted to the first to fifth mounting portions 33A1-33B1 of the first yoke YA. The other ends of the first to fifth poles 31A-31E are mounted to the sixth to tenth mounting portions 33A2-33E2 of the second yoke YB. The first yoke YA is separated from the second yoke YB by a constant distance due to the first to fifth poles 31A-31E.

The base member 45 has the first to fifth restraint portions 34A-34E, which are an opening such as a hole, indentation or a notch. The first to fifth poles 31A-31E are inserted through the first to fifth restraint portions 34A-34E, respectively. The first to fifth restraint portions 34A-34E prevent the movable unit 15a from moving outside a predetermined range by the inner periphery of at least one of the first to fifth restraints 34A-34E contacting the first to fifth poles 31A-31E at the limit of the predetermined range. Namely, the movable unit 15a can move within the predetermined range in the plane xy, but cannot move outside the predetermined range.

In the state when the power of the digital camera is off, an electro-magnetic force is not generated by the coil and magnetic field generator, so the movable unit 15a is not held in a specific position by electro-magnetic force. Therefore, the movable unit 15a is moved by a gravitational force, until at least one of the first to fifth poles 31A-31E meets the inner periphery of at least one of the first to fifth restraints 34A-34E. Namely, the movable unit 15a is held by the hold unit 15b at the point of contacting the inner periphery of the restraint portions, in this case.

The first yoke YA has first to third ball receivers 32A1-32C1 which are provided on the facing surface YA1, and first to third balls 32A3-32C3 which are rotatably provided in the first to third ball receivers 32A1-32C1, respectively.

The second yoke YB has fourth to sixth ball receivers 32A5-32C5 which are provided on the facing surface YB1, and fourth to sixth balls 32A4-32C4 which are rotatably provided on the fourth to sixth ball receivers 32A5-32C5, respectively. Each of the fourth to sixth ball receivers 32A5-32C5 is disposed on a liner parallel to the third direction z, which also passes through each of the first to third ball receivers 32A1-32C1.

A pressure probe (not shown in Figs.) is screwed into each of the first to third ball receivers 32A1-32C1. The pressure probes push the base member 45 away from the first yoke YA through the first to third balls 32A3-32C3, so that the base member 45, namely the movable unit 15a, which is interposed between the first and second yokes YA and YB, is movably held by the yokes YA and YB through the balls 32A3-32C3 and 32A4-32C4.

The base member 45 has a facing surface 45A which faces the first yoke YA. The base member 45, namely the facing surface 45A, is disposed perpendicularly to the direction z. The imaging sensor 15 in mounted on the facing surface 45A. The low-pass filter LF is disposed on the first yoke YA side of the imaging sensor IS. In an initial state, namely before the movable unit is a starts to move for anti-shake operation for image stabilizing, the base member 45 is disposed at a center position such that the optical axis O passes through the center of the effective imaging field of the imaging sensor IS, and the sides of the rectangular effective imaging field are squarely aligned in the first direction x and the second direction y. The state where the base member 45 is disposed at the center position is defined as the state where the movable unit 15a is located at the standard position. Further, the movable unit 15a is disposed at the center position by the electro-magnetic force generated by an electric current input to the coils.

The first yoke YA is disposed on the lens barrel 2 side of the second yoke YB. The first yoke YA has a hole 35 which is disposed at a position corresponding to the imaging sensor IS, in order not to obstruct any incident light which passes into the effective imaging field of the imaging sensor IS.

The first and second horizontal magnetic field generators MXA and MXB, which are arranged on either side of the hole 35 in the first direction x, aligned in the second direction y, are fixed to the facing surface YA1 of the first yoke YA. The first and second vertical magnetic field generating MYA and MYB, which are arranged below the hole 35 aligned and adjacent in the first direction x, are fixed to the facing surface YA1.

The first and second horizontal driving coils CXA and CXB, which are arranged on either side of the imaging sensor IS in the first direction x, aligned in the second direction y, are fixed to the facing surface 45A of the base member 45. The first and second vertical driving coils CYA and CYB, which are arranged below the imaging sensor IS aligned and adjacent in the first direction x, are fixed to the facing surface 45A.

The horizontal hall element 40A is provided at the center position of the first horizontal driving coil CXA, but no hall element is provided on the center position of the second horizontal driving coil CXB. The first and second vertical hall elements 41A and 41B are provided at the center position of the first and second vertical driving coils CYA and CYB, respectively.

The first horizontal driving coil CXA and the horizontal hall element 40A face the first horizontal magnetic field generator MXA in the third direction z. The second horizontal driving coil CXB faces the second horizontal magnetic field generators MXB in the third direction z.

The first vertical driving coil CYA and the first horizontal hall element 41A face the first vertical magnetic field generator MYA in the third direction z. The second vertical driving coils CYB and the second horizontal hall element 41B face the second vertical magnetic field generator MYB in the third direction z.

The coil pattern of the first horizontal driving coil CXA has a line segment which is parallel to the second direction y, so that the movable unit 15a, which includes the first horizontal driving coil CXA, moves in the first direction x by the electromagnetic force generated from an electric current input to the coil CXA and a magnetic field generated by first horizontal magnetic field generator MA.

The coil pattern of the second horizontal driving coil CXB has a line segment which is parallel to the second direction y, so that the movable unit 15a, which includes the second horizontal driving coil CXB, moves in the first direction x by electromagnetic force generated from an electric current input to the coil CXB and a magnetic field generated by the second horizontal magnetic field generator MXB.

The coil pattern of the first vertical driving coil CYA has a line segment which is parallel to the first direction x, so that the movable unit 15a, which includes the first vertical driving coil CYA, moves in the second direction y by electro magnetic force generated from an electric current input to the coil CYA and a magnetic field generated by the first vertical magnetic field generator MYA.

The coil pattern of the second vertical driving coil CYB halo a line segment which is parallel to the first direction x, so that the movable unit 15a, which includes the second vertical driving coil CYB, moves in the second direction y by electromagnetic force generated from an electric current input to the coil CYB and a magnetic field generated by the second vertical magnetic field generator MYB.

The first and second yokes YA and YB prevent the magnetic field of the magnetic field generators MXA, MXB, MYA and MYB from diffusing. Due to this, the magnetic-flux density between the first horizontal driving coil CXA and the first horizontal magnetic field generator MXA is increased. Similarly, the magnetic-flux density between the second horizontal driving coil CXB and the second horizontal magnetic field generator MXB, the magnetic-flux density between the first vertical driving coil CYA and the first vertical magnetic field generator MYA, and the magnetic-flux density between the second vertical driving coil CYB and the second vertical magnetic field generator MYB are increased.

In the anti-shake apparatus of this embodiment, the hand-shake quantity is detected by an angular velocity sensor (not shown in Figs.), and the image blur on the imaging sensor IS is calculated, based on the hand-shake quantity, by the CPU 80 (shown in FIG. 7) per a predetermined time. A target position where the imaging sensor should move to in order to reduce the image blur is calculated according to the amount of image blur. After calculating the target position, electric current is input to each coil so that the movable unit 15a is moved in the plane xy by the electro-magnetic force generated by the inputting electric current in order to move the imaging sensor IS to the target position.

The horizontal hall element 41A senses the magnetic field which is generated by the first horizontal magnetic field generator MXA so that the CPU detects the position in the first direction x of the hall element 40A relative to the magnetic field generator MXA. Namely, the CPU detects the position in the first direction of the movable unit 15a relative to the hold unit 15b. Similarly, the first and second vertical hall elements 41A and 41B sense the magnetic fields which are generated by the first and second vertical magnetic field generators MYA and MYB, respectively, so that the CPU detects the position in the second direction y of the movable unit 15a relative to the hold unit lb.

The CPU calculates the movement quantity of the movable unit 15a relative to the hold unit 15b from the detected position in the first and second directions x and y. The CPU adjusts the amount of electric current input to each coil, referring to the movement quantity, so as to move the imaging sensor IS to the target position for reducing image blur in the imaging sensor IS.

Figure 4:
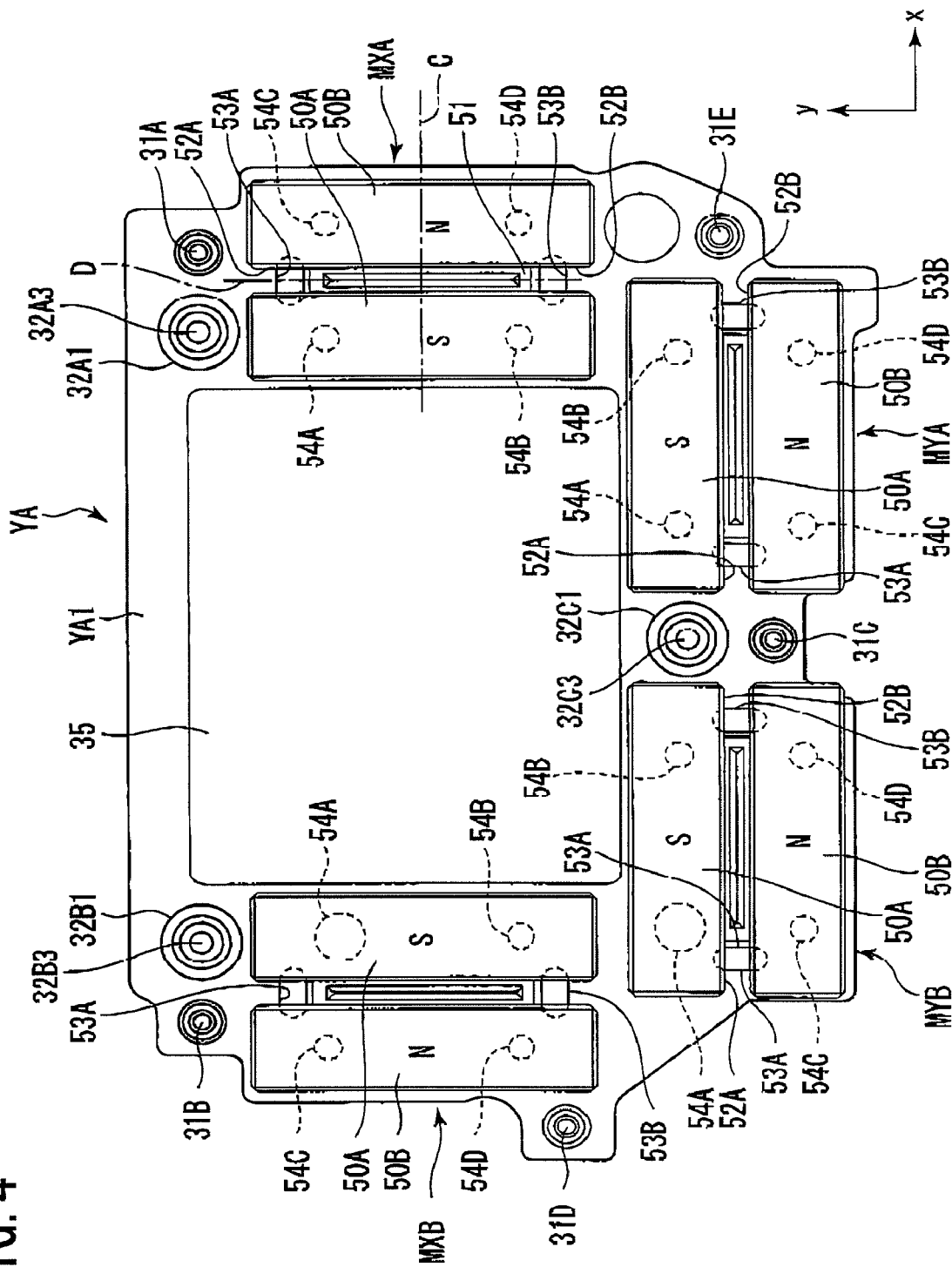
FIG. 4 is a plan view of a facing surface of the first yoke.
Figure 5:
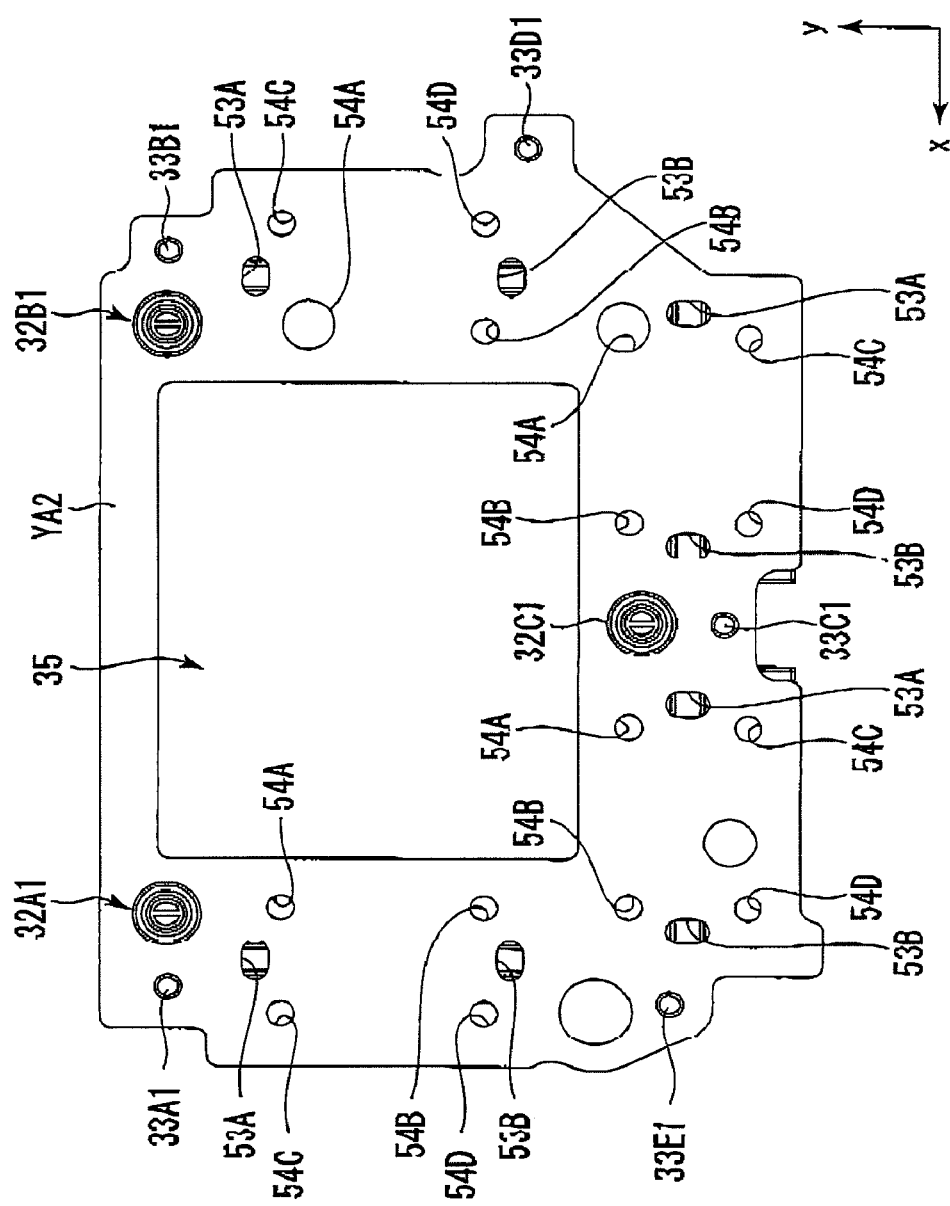
FIG. 5 is a plan view of the opposite surface of the first yoke.

FIGS. 4 and 5 show the first yoke YA. The first yoke YA has a guide portion including the pair of first and second guide openings (guide holes) 53A and 53B which are disposed at a position of the first yoke YA where the first horizontal magnetic field generator MXA is disposed. The first and second guide openings 53A and 533, which penetrate from the opposite surface YA2 through to the facing surface YA1, are in the form of a slot extending in the first direction x, and are arranged adjacent in the second direction y.

The horizontal magnetic field generators MXA has a first and second magnets 50A and 50B aligned in the second direction y, and a spacer 51 composed of a nonmagnetic body. The first and second magnets 50A and SOB, which are adjacently arranged in the first direction x, are bonded through the spacer 51. The length of the spacer 51 in the second direction y is shorter than that of the first and second magnets BOA and 50B. Therefore, both ends of the spacer 51 in the second direction y are disposed inside both ends of the first and second magnets 50A and 50B in the second direction y, so as to form first and second indentations 52A and 52B at both ends of the first horizontal magnetic field generators MXA in the second direction y. Further, the first and second indentations 52A and 523 constitute an engaged portion to be engaged with an adjustment apparatus 70 as described later.

The front side of the first magnet 50A in FIG. 4 (namely, the movable unit 15a side) is the south pole, and the back side thereof in FIG. 4 (namely, the lens barrel side 2) is the north pole. On the other hand, the back side of the second magnet 50B in FIG. 4 is the south pole, and the front side thereof in FIG. 4 is the north pole. Namely the north and south poles of the second magnet 50B are disposed conversely to those of the first magnet 50A in the third direction z. Therefore, the north pole of the second magnet 50B and the south poles of the first magnet 50A are adjacently arranged in the first direction x on a facing surface of the first horizontal magnetic field generators MXA, which face the horizontal hall element 40A.

The first and second indentations 52A and 52B overlap onto the first and second guide openings 53A and 53B, respectively. The center position C of the first horizontal magnetic field generator MXA in the second direction y is interposed between the first and second guide openings 53A and 53B.

The width of the first and second indentations 52A and 52B in the first direction X is shorter than the length of the first and second guide openings 53A and 53B. The first and second guide openings 53A and 53B are disposed such that their center part in the first direction x are coincident with the first and second indentations 52A and 52B, respectively, but both of their ends in the first direction x are overlapped by the first and second magnets 50A and BOB.

The first yoke YA has first to fourth injection openings 54A-54D, which are a substantially circular hole. The first to fourth injection openings 54A-54D are disposed at a position where the horizontal magnetic field generator MXA overlaps. The first and second injection openings 54A and 54B, over which the first magnet 50A overlaps, are disposed such that the center position C is interposed between them. The first and second injection openings 54A and 54B are disposed near the first and second guide openings 53A and 54B, respectively, and are closer in the second direction y to the center position C than the first and second guide openings 53A and 54B, respectively.

The third and fourth injection openings 54C and 54D, over which the second magnet BOB overlaps, are disposed such that the center position C is interposed between them. The third and fourth injection openings 54C and 54D are disposed near the first and second guide openings 53A and 53B, respectively, and are closer in the second direction y to the center position C than the first and second guide openings 53A and 53B, respectively.

The second horizontal magnetic field generator MXB has a similar structure to the first horizontal magnetic field generator MXA, so this explanation will be omitted. Of course, the guide openings 53A and 53B and the injection openings 54A-54D are provided at a position on the first yoke YA where the second horizontal magnetic field generator MXB overlaps similarly.

The first and second vertical magnetic field generators MYA and MYB have the same structure as the first horizontal magnetic field generators MXA, other than that the generators MYA and MYB are rotationally disposed at an angle of 90 degrees in the plane xy compared to the generator MXA. Similarly, the guide openings 53A and 53B and the injection openings 54A-54D are provided at a position on the first yoke YA where the generators MYA and MYB overlap. Further, one, or more than one opening of the plurality or the injection openings are larger than other injection openings, but may have the same size as other injection openings.

Next, the method of assembling the anti-shake unit will be explained below; in the present embodiment, eat first, the low-pass filter LF, the imaging sensor IS, the coils CXA, CXB, CYA and, CYB, and the hall elements 40A, 41A, and 41B are mounted on the base member 45, and the magnetic field generators MXA, MXB, MYA, and, MYB, the ball receivers, and the balls are mounted on the first yoke YA. Further, the ball receivers and the balls are mounted on the second yoke YB.

At this time, the magnetic field generators MXA, MXB, MYA, and MYB are attracted by magnetic power because the first yoke YA is composed of a magnetic body. Further, the first and second indentations 52A and 52B of the magnetic field generators MXA, MXB, MYA, and MYB overlap onto the first and second guide openings 53A and 53B, respectively.

Next, the base member 45 is interposed between the first and second yokes YA and YB, and then they are combined to form the anti-shake unit IS, having the movable unit 15a and the hold unit 15b, by using the first to fifth poles 31A-31E. Namely, one end of each of the first to fifth poles 31A-31E is attached to the first to fifth mounting portions 33A1-33E1, respectively, and the other end of each of the first to fifth poles 31A-31E is attached to the sixth to tenth mounting portions 33A2-33E2 by way of, e.g., a screw. At this time, the first to fifth poles 31A-31E are inserted through the first to fifth restraint portions 34A-34E, respectively.

After the anti-shake unit 15 is formed, the facing surface YA1 or the first yoke YA faces the facing surface 45A of the base member 45 where the hall elements 40A, 41A, and 418 are mounted. Therefore, the first horizontal magnetic field generator MXA, and the first and second vertical magnetic field generator MYA and MYB face the horizontal hall element 400A and the first and second vertical hall elements 41A and 42B, respectively. However, the second horizontal magnetic field generator MXB does not face a hall element because a hall element is not provided at the center of the second horizontal driving coil CXB.

It is necessary that the horizontal hall element 40A faces a boundary D of the first horizontal magnetic field generator MXA when the movable unit 15a is located in the standard position, in order to maximize the detection capability of the horizontal hall element 40A. Further, the boundary D, which lies aligned in the second direction y at the center of the generator MXA in the first direction x, is the boundary between north and south poles that are arranged on the facing surface of the generator MXA, which faces the hall element 40A. However, when the anti-shake unit 15 is assembled, a positional error usually occurs, so that the hall element 40A does not usually face the boundary D of the generator MXA.

In the present embodiment, after assembling the anti-shake unit 15, the CPU detects the position of the first horizontal magnetic field generators MXA relative to the horizontal hall element 40A, based on a hall output signal which is output from the horizontal hall element 40A while the movable unit 15a is located in the standard position. According to the detected relative position, the position of the first horizontal magnetic field generator MXA is adjusted so that the horizontal hall element 40A faces the boundary D or a position close to the boundary D.

Next, the method of adjusting the position of the magnetic field generator will be explained in detail. In this method, an adjustment apparatus 70 is used for adjusting the position of the magnetic field generator. The adjustment apparatus 70 is formed of a pair of rod members 71 extending parallel to each other, and a connecting portion 72 connecting the pair of rod members 71 as one integral body. The length of the connecting portion, namely the distance between the pair of rod members 71 is same as that between the guide openings 53A and 53B which the same magnetic field generator overlap onto.

One of the rod members 71 is inserted into the pair of the first guide opening 53A and the first indentation 52A which overlap each other, and the other rod member 71 is inserted into the pair of the second guide opening 53B and the second indentation 52B which overlap each other. The adjustment apparatus 70 is then moved in the first direction x. Due to this movement, the pair of rod members 71 is moved in the longitudinal direction of the guide openings 53A and 5313, engaging the first and second indentations 52A and 52B, respectively, so that the pair of rod members 71 pushes the first horizontal magnetic field generator MXA in the first direction x.

As described above, the first horizontal magnetic field generator MXA is mounted on the first yoke YA by magnetic attraction. Consequently, the first horizontal magnetic field generators MXA are slid while attracted to the facing surface YA1, along the facing surfaces YA1, in the first direction x, by moving the adjustment apparatus 70.

Further, the connecting portion is moved by a hold member (not shown in the figure) which holds the connecting portion, so that the pair of rod members 71 is moved, for example.

Figure 6:
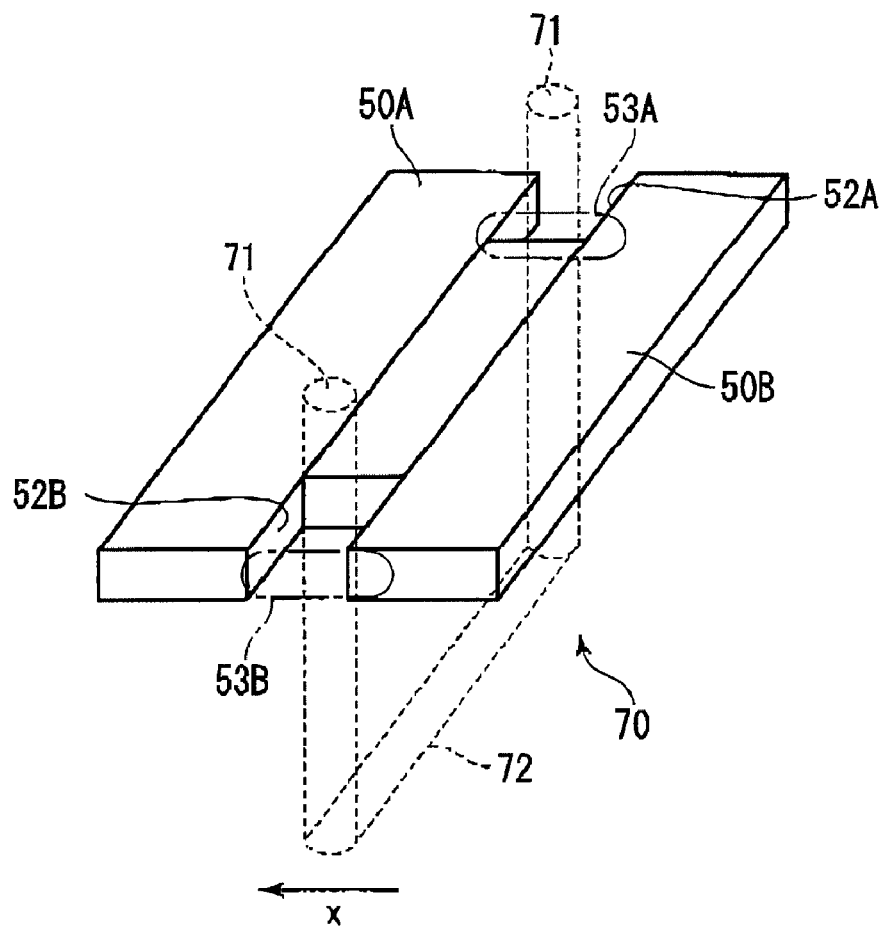
FIG. 6 is a perspective view of a magnetic field generator when it is being slid.

When the adjustment apparatus 70 is moved in a direction indicated by the arrow in FIG. 6, the rod member 71 engages with the side wall of the first magnet 50A and pushes the side 5 wall so that the horizontal magnetic field generator MXA is slid in the arrow direction. Similarly, when the adjustment apparatus 70 is moved in the reverse direction of the arrow direction, the horizontal magnetic field generator MXA is slid in the reverse direction. The generators MXA is slid in the first direction x so as to adjust their position such that the horizontal hall element 40A faces the boundary D or a position close to the boundary D.

After adjusting the position of the generators MXA, an adhesive is injected between the facing surface YA1 of the first yoke YA and the horizontal magnetic field generators MXA through the first to fourth injection openings 54A-54D. The injected adhesives is cured, so the horizontal magnetic field generator MXA is fixed onto the facing surface YA1 by the cured adhesive. Similarly, the first and second vertical magnetic field generators MYA and MYB are fixed onto the facing surface YA1, after adjusting the positions thereof.

Further, the second horizontal magnetic field generator MXB is fixed on the facing surface YA1 without adjusting the position thereof, because a hall element is not provided at a position towards which the generator MXB faces. Furthermore, as for the adhesive, a photo-curing resin is preferably used.

Figure 7:
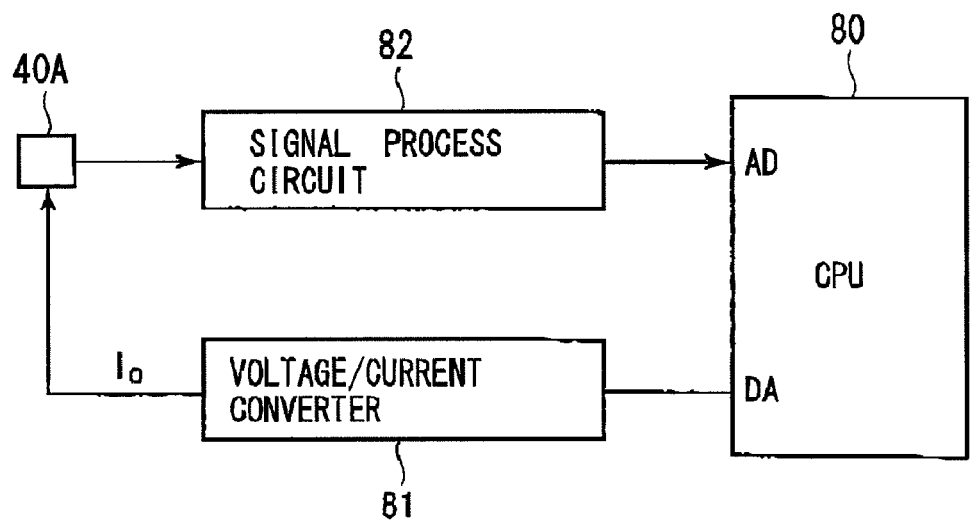
FIG. 7 is a block diagram of the control circuit of a horizontal hall element.

FIG. 7 shows the control circuit of the horizontal hall element 40A. The horizontal hall element 40A is controlled by the CPU 80. A predetermined analog signal is output to a voltage/current converter 81 from a terminal DA of the CPU 80. In the voltage/current converter 81, the predetermined analog signal is converted to an electric current having a standard current value $I_0$, which is input to the horizontal hall element 40A.

The horizontal hall element 40A outputs the hall output signal as an analog signal based on the standard current value $I_0$ and the magnetic-flux density at the element 40A. The hall output signal undergoes predetermined a signal processing by a signal process circuit 82, and then is input to the CPU 80. The hall output signal is converted to a digital signal at a terminal AD of the CPU 80. The CPU 80 detects the position of the first horizontal magnetic field generator MXA relative to the horizontal hall element 40A, based on the output value Pn of the digital signal of the hall output signal.

Next, the relationship between the relative position of the generator MXA and the hall output signal will be explained below using FIGS. 8 and 9. FIG. 8 shows the relationship between the relative position (a) of the generator MXA to the hall element 40A, with (b) the magnetic-flux density at the hall element 40A, and with (c) the output value Pn of the hall output signal. Next, the changes in the magnetic-flux density (b) and the output value Pn (C), when the relative position (a) of the hall element 40A is changed in the first direction x, will be explained.

When the horizontal hall element 40A faces the boundary D of the generator MXA, the magnetic-flux density (b) at the hall element 40A becomes substantially zero. On the other hand, when the hall element 40A is displaced from a centered position which corresponds to the boundary D in the first direction x towards the second magnet 50B side, the magnetic-flux density becomes proportionally larger as the hall element 40A is moved further from the boundary D. Further, when the hall element 40A is displaced from a position which corresponds to the boundary D in the first direction x to the first magnet 50A side, the magnetic-flux density becomes proportionally smaller as the hall element 40A is moved further from the boundary D.

The output value Pn of the hall element 40A is changed in proportion to the change of the magnetic-flux density. Therefore, the output value Pn is changed according to the relative position (a) of the generator MXA to the hall element 40A.

Figure 9:
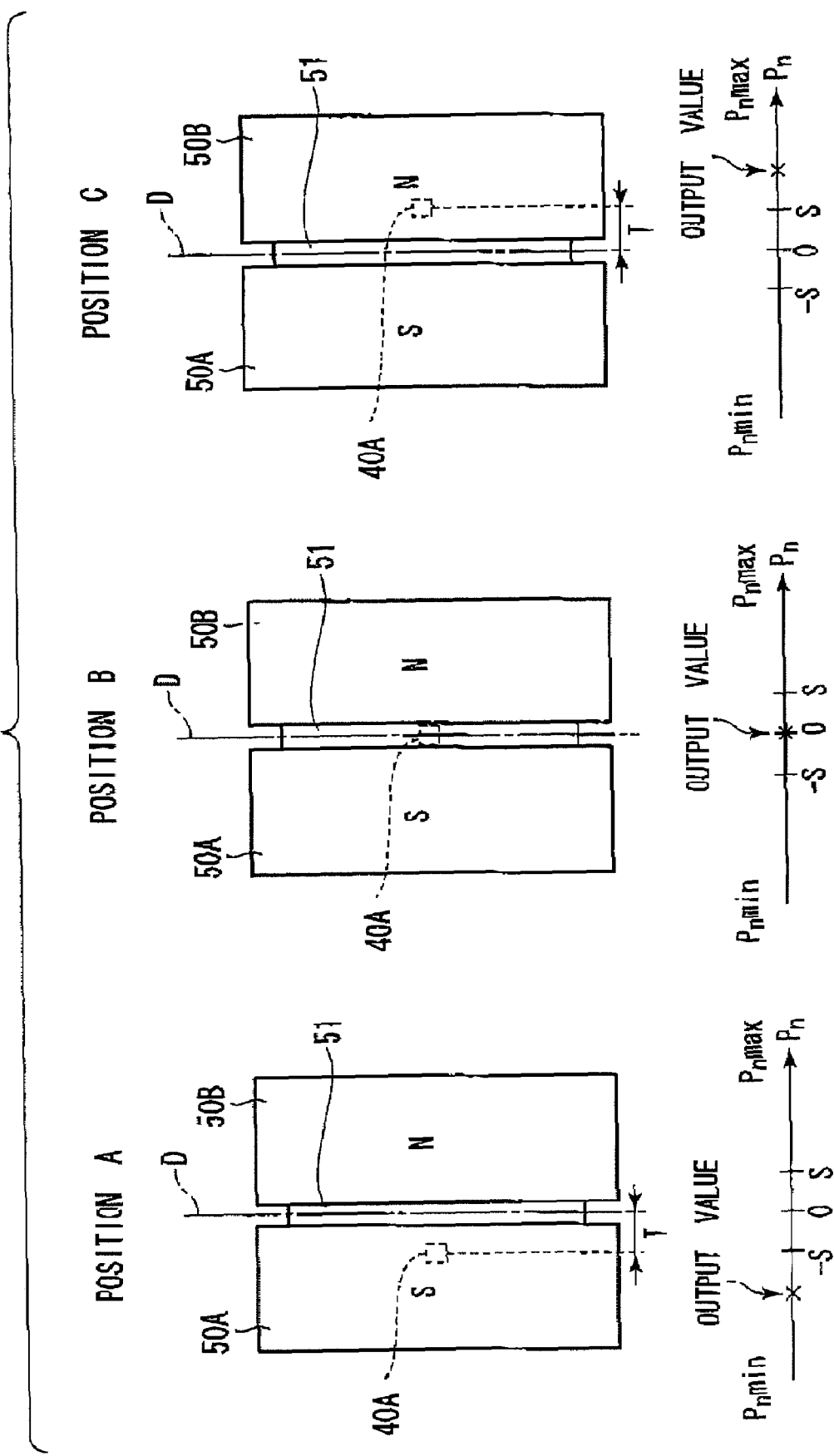
FIG. 9 is a schematic view of the output values of the hall output signal according to the position of the hall element.

As shown in FIG. 9, for example, when the horizontal hall element 40A is disposed at a position (position B) which corresponds to the boundary D, the output value Pn is a standard value (0). On the other hand, when the horizontal hall element 40A is displaced towards the first magnet B0A side (position A), the output value Pn becomes a negative value and smaller in proportion to a displacement amount T of the element 40A from the position B in the first direction x. Further, when the horizontal hall element 40A is displaced towards the second magnet B0B side (position C), the output value Pn becomes a positive value and larger in proportion to the displacement amount T. Therefore, when the horizontal hall element 40A corresponds to the boundary D or a position close to the boundary D of the generator MXA, the absolute value of the output value Pa is zero or an approximate value of zero, namely not more than predetermined value (threshold S).

Figure 10:
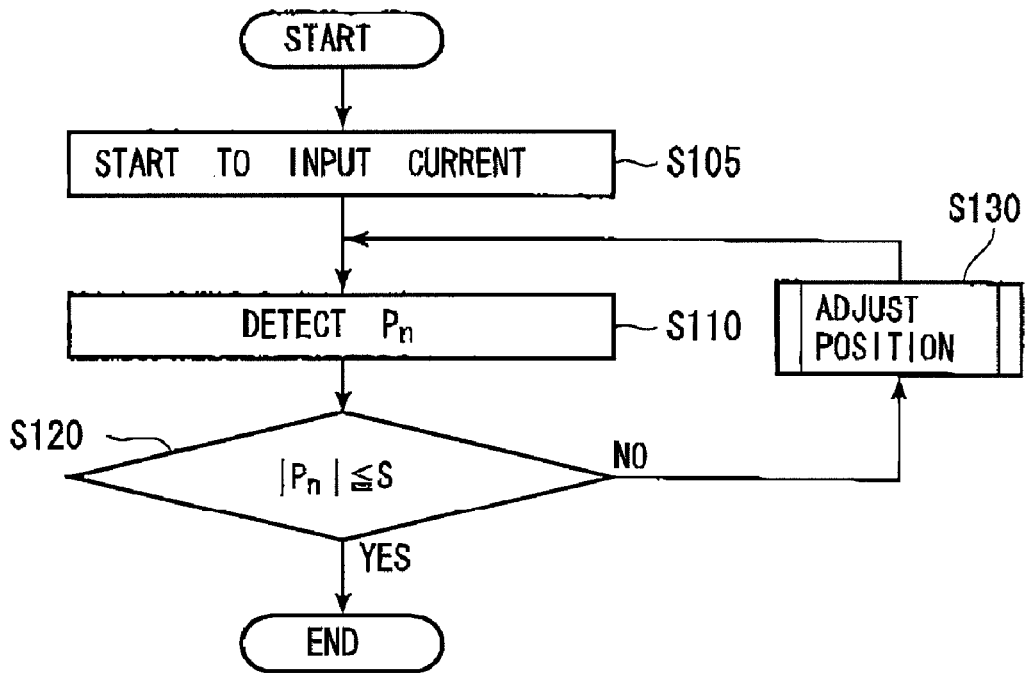
FIG. 10 is a flowchart of an adjustment routine for adjusting the position of the magnetic field generator.

Next, the adjustment routine of the position of the generator MXA will be explained below, using the flowcharts in FIGS. 10 and 11. The adjustment routine is conducted in the state where the movable unit 15a it located at the standard position, after assembling the anti-shake unit 15. Further, before the adjustment routine starts, the adjustment apparatus 70 is prepared such that one of the rod members 71 is inserted into the first guide opening 53A and the first indentation 52A, and the other rod member 71 is inserted into the second guide opening 53B and the second indentation 52B. Furthermore, before the adjustment routine starts, the generator MXA is not fixed to the first yoke YA with adhesive, so it can be slidingly moved by the adjustment apparatus 70.

In this routine, at first, the value of electric current to be input to the horizontal hall element 40A is determined as the standard current value $I_0$, and then the electric current starts to be input to the hall element 40A, at step S105.

At step S110, the hall output signal output from the hall element 40A is read, and the output value Pn of the hall output signal is detected at the CPU 80. At step S120, an absolute value of the output value Pn is calculated, and then the absolute value is compared with the threshold S. When the absolute value is not greater than the threshold S, the output value Pn is zero, or is an approximate value of zero and the horizontal hull element 40A faces the boundary D or a position close to the boundary D. Therefore, this routine is finished if it is determined that the absolute value is not greater than the threshold S at step S120.

After step 5120, this routine proceeds to step S130 in order to adjust the position of the generator MXA if it is determined that the absolute value is greater than the threshold S, because this indicates that the hall element 40A is not disposed at or near to the boundary D.

Figure 11:
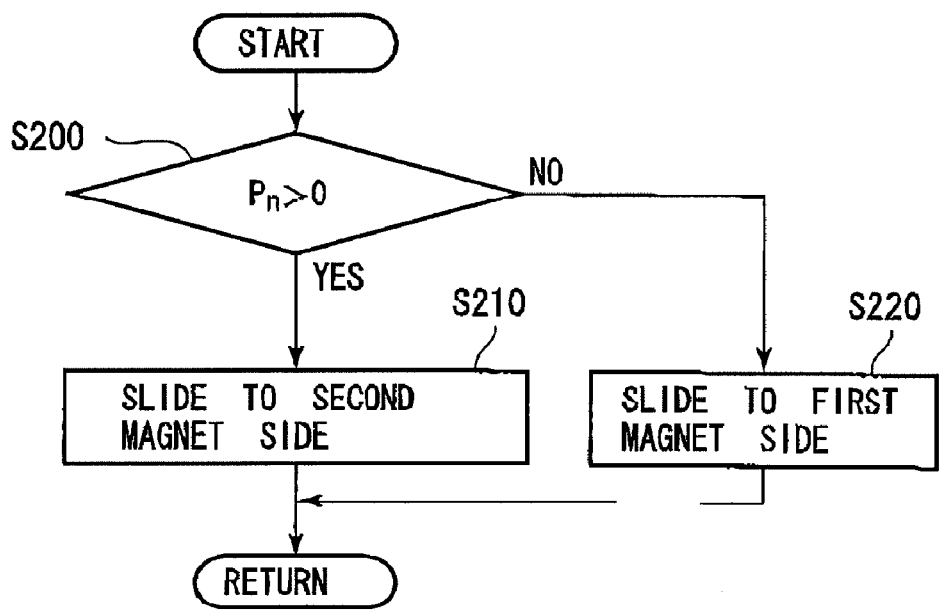
FIG. 11 is a flowchart of a subroutine of the adjustment routine.

At step S130, the subroutine of FIG. 11 for adjusting the position of the generator MXA is conducted. In this subroutine, at first, it is determined whether the output value Pn is greater than zero, at step S200. If so, the generator MXA is slidingly moved for a predetermined distance in the first direction x towards the second magnet 50B side by the adjustment apparatus 70 at step S210, because the hall element 40A is displaced towards the second magnet 50B side from the boundary D.

On the other hand, if it is determined that the output value Pn is not greater than zero, the generator MXA are slidingly moved for a predetermined distance in the first direction x towards the first magnet 50A side by the adjustment apparatus 70 at step S220, because the hall element 40A is displaced towards the first magnet 50A side from the boundary D.

After completing step S210 or step S220, the routine goes back to step S110, and then it is determined whether the hall element 40A faces the boundary D, or a position close to the boundary D, at steps S110 and S120. If so the routine is finished; but if not, the subroutine for adjusting the position of the generator MXA is conducted again.

After finishing this routine, the pair of rod members 71 is removed from the first and second guide openings 53A and 53B and the first and second indentations 52A and 52B. Next, adhesive is injected between the generator MXA and the facing surface YA1 of the first yoke YA through the first to fourth injection openings 54A-54D, so that the generator MXA is fixed on the facing surface YA1.

The adjustment of the position of the first and second vertical magnetic field generators MYA and MYB is similar to that of the first horizontal magnetic field generator MXA.

In this embodiment, in the state where the movable unit 15a is located at the standard position, if the hall element 40A does not face a desirable position of the magnetic field generator, the position of the magnetic field generator is changed by the adjustment apparatus 70, so that the hall element accurately faces the desirable position. This strengthens the detection capability of the hall element.

Further, in this embodiment, each magnetic field generator is pushed and slidingly moved by the action of the pair or the rod members moving along the guide opening which extends in the predetermined direction. In this case, the pair of rod members is integrally moved, namely the two members are moved the same distance in the same direction and push the magnetic generator with the same power, because they are formed into one integral body by the connecting portion. Therefore, the magnetic field generator can be linearly slid in the predetermined direction (for example, the first direction x), without tilt.

In addition, the diameter of the rod members is substantially same as the width of the guide opening; therefore, it is easy to move the rod member linearly and without tilt in the longitudinal direction of the guide opening.

Further, the pair of rod members may not be formed into one integral body. However, in this case, the pair of rod members is preferably moved the same distance in the same direction, with the same power, in order to linearly move the magnetic field generator in the predetermined direction, without tilt.

In this embodiment, the imaging sensor IS is mounted on the base member 45 of the movable unit 15a, so that the imaging sensor IS is moved together with the movable member 15a in the plane xy in order to reduce the image blur.

However, the imaging sensor IS may not be mounted on the movable unit 15a and may not move with the movable member 15a. In this case, a correcting lens may be mounted on the movable unit 15a instead of the imaging sensor IS, so that the correcting lens is moved in the plane xy to reduce the image blur.

Further, in the present embodiment, the engaged portion with which the rod members are engaged is in the form of indentations, but it may be in the form of another portion with which the rod member can be engaged. For example, the engaged portion may be in the form of a convex, a project, a hole, or a notch.

Furthermore, the magnetic field generator may be provided on the movable unit 15a and the hall element may be mounted on the hold unit 15b. In this case, the movable unit 15a has a guide opening and an injection opening or which the magnetic field generator overlaps.

Further, the guide opening is preferably an opening whose inner periphery is completely closed, such as a hole in this embodiment. However, the guide opening may be an opening having an inner periphery of which a part is opened, such as a notch or an indentation.

Although the embodiments of the present invention have been described herein with reference to the accompanying drawings, obviously many modifications and changes can be made by those skilled in this art without departing from the scope of the invention.

The present disclosure relates to subject matter contained in Japanese Patent Application No. 2006-192722 (filed on Jul. 13, 2006) which is expressly incorporated herein, by reference, in its entirety.

The invention claimed is:

1. A position detecting device, comprising:
a movable unit;
a hold unit that movably holds said movable unit, one unit of said movable unit and said hold unit having a first surface and a second surface, which is an opposite surface of said first surface;
a magnetic field generator, which is provided on said first surface, that generates a magnetic field;
a magnetic field sensor, which is provided on the other unit of said movable unit and said hold unit, that senses said magnetic field so as to detect a position of said movable unit relative to said hold unit;
a guide portion having a guide opening that penetrates through from said second surface to said first surface; and
an engaged portion that is provided on said magnetic field generator and is disposed at a position corresponding to said guide opening,
wherein said magnetic field generator is fixed on said first surface after said magnetic field generator is slidingly moved along said first surface by a rod member that is inserted into said guide opening and engaged with said engaged portion so as to dispose said magnetic field generator to a predetermined position.

2. A device according to claim 1, wherein said magnetic field sensor faces said magnetic field generator, and detects said position of said movable unit in a first direction parallel to said first surface,
said magnetic field generator having a racing surface that faces said magnetic field sensor, and north and south poles that are adjacently arranged in said first direction on said facing surface,
said magnetic field generator is slidingly moved in said first direction by said rod member.

3. A device according to claim 2, wherein said guide opening is a slot aligned in said first direction, and said engaged portion has an indentation that coincides with a part of said guide opening.

4. A device according to claim 2, wherein said magnetic field generator is fixed so that said magnetic field sensor faces a boundary on said facing surface between said north and south poles, or a position near to said boundary, when said movable unit is located in a standard position.

5. A device according to claim 2, wherein said magnetic field generator comprises a first magnet having said north pole and a second magnet having said south pole, and a spacer composed of a nonmagnetic body, said first and second magnets bonded through said spacer and arranged adjacently in said first direction, two ends of said spacer, which are disposed in a second direction, being configured at an inside ot two ends of said first and second magnets in said second direction so as to form an indentation on two ends of said magnetic field generator in said second direction, said second direction parallel to saif first surface and perpemdicular to said first direction, said indentation constituting said engaged portion.

6. A device according to claim 1, wherein said magnetic field generator is disposed in said predetermined position based on the detected position of said movable unit.

7. A device according to claim 1, wherein said one unit has a yoke having said first surface, and said magnetic field generator is slidingly moved by said rod member while attracted to said first surface by magnetic power.

8. A device according to claim 1, wherein said engaged portion has first and second engaged elements that are provided on said magnetic field generator, said guide portion having first and second guide openings, said first and second engaged elements disposed at positions corresponding to said first and second guide openings, respectively.

9. A device according to claim 8, wherein said first and second guide openings are entered by first and second rod members while said first and second rod members are engaged with said first and second engaged elements, respectively, said first and second rod members are integrally moved in order to slidingly move said magnetic field generator.

10. A device according to claim 1, wherein said one unit has an injection opening provided at a position which said magnetic field generator overlaps, said injection opening penetrating from said first surface through to said second surface, an adhesive injected through said injection opening to fix said magnetic field generator to said one unit.

11. A device according to claim 1, wherein an imaging sensor or a correcting lens that is mounted on said movable unit is moved for anti-shake operation for image stabilizing by said movable unit.

12. A method of adjusting a position of a magnetic field generator which generates a magnetic field, comprising:

mounting said magnetic field generator on one unit of a movable unit and a hold unit that movably holds maid movable unit, an engaged portion provided on said magnetic field generator, said one unit comprising a first surface, a second surface and a guide opening, said second surface being an opposite surface of said first surface, said guide opening penetrating from said second surface through to said first surface, said engaged portion disposed at a position corresponding to said guide opening;

mounting a magnetic field sensor on the other unit of said movable unit and said hold unit, said magnetic field sensor sensing said magnetic field so as to detect a position of said magnetic field generator relative to said magnetic field sensor;

inserting a rod member into said guide opening to engage with said engaged portion; and moving said rod member while inserted into said guide opening so that said magnetic field generator is slidingly moved along said first surface in order to dispose said magnetic field generator at a predetermined position.

* * * * *